United States Patent
Wu et al.

(10) Patent No.: US 11,100,865 B2
(45) Date of Patent: Aug. 24, 2021

(54) DISPLAY PANEL, DISPLAY SCREEN AND ELECTRONIC DEVICE

(71) Applicant: BEIJING XIAOMI MOBILE SOFTWARE CO., LTD., Beijing (CN)

(72) Inventors: Tsangchih Wu, Beijing (CN); Yung Chi Wen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/808,343

(22) Filed: Mar. 3, 2020

(65) Prior Publication Data

US 2021/0090501 A1 Mar. 25, 2021

(30) Foreign Application Priority Data

Sep. 20, 2019 (CN) .......................... 201910894473.3

(51) Int. Cl.
*G09G 3/3258* (2016.01)
*G06F 1/16* (2006.01)
*H01L 27/32* (2006.01)

(52) U.S. Cl.
CPC ......... *G09G 3/3258* (2013.01); *G06F 1/1626* (2013.01); *H01L 27/3276* (2013.01); *G09G 2300/0426* (2013.01)

(58) Field of Classification Search
CPC .. G09G 3/3258; G06F 1/1626; H01L 26/3276
USPC .................. 345/204; 1/2; 257/40; 315/169.1
See application file for complete search history.

(56) References Cited

U.S. PATENT DOCUMENTS

| | | | | |
|---|---|---|---|---|
| 10,126,851 | B2* | 11/2018 | Yeh | G06F 3/0443 |
| 2003/0189410 | A1* | 10/2003 | Yamazaki | G09G 3/3275 |
| | | | | 315/169.1 |
| 2009/0279029 | A1* | 11/2009 | Kunii | G02F 1/13318 |
| | | | | 349/116 |
| 2010/0207849 | A1 | 8/2010 | Cok et al. | |
| 2014/0231790 | A1* | 8/2014 | Fujino | H01L 27/3213 |
| | | | | 257/40 |

(Continued)

FOREIGN PATENT DOCUMENTS

| | | |
|---|---|---|
| EP | 0689181 A1 | 12/1995 |
| EP | 3428967 A1 | 1/2019 |

(Continued)

OTHER PUBLICATIONS

OA1 for EP Application 20160379.2, dated Jun. 19, 2020.
OA2 for EP Application 20160379.2, dated Sep. 4, 2020.

*Primary Examiner* — Prabodh M Dharia
(74) *Attorney, Agent, or Firm* — Syncoda LLC; Feng Ma

(57) ABSTRACT

A display panel includes a substrate and a plurality of pixels arranged on the substrate, and the pixel includes a plurality of sub pixels, and a driving circuit. The sub pixel includes a first electrode layer on the substrate, a light-emitting layer on the first electrode layer, and a second electrode layer on the light-emitting layer. The driving circuit is arranged between the substrate and the first electrode layer, and electrically coupled with the sub pixels. The driving circuit includes a driving control module and a drive line electrically coupled with the driving control module. The driving control module is arranged below a part of the sub pixels electrically coupled with the driving circuit, and the drive line is electrically coupled with the sub pixels, respectively.

20 Claims, 7 Drawing Sheets

(56) References Cited

U.S. PATENT DOCUMENTS

| | | | |
|---|---|---|---|
| 2016/0062028 A1* | 3/2016 | Aoki | G02B 6/0046 |
| | | | 362/606 |
| 2016/0163777 A1* | 6/2016 | Ozawa | H01L 27/3276 |
| | | | 257/40 |
| 2018/0269268 A1 | 9/2018 | Cai et al. | |
| 2019/0252484 A1* | 8/2019 | Choi | H01L 27/3276 |
| 2020/0235185 A1* | 7/2020 | Nie | G09G 3/3233 |
| 2020/0402443 A1* | 12/2020 | Lou | H01L 51/5203 |

FOREIGN PATENT DOCUMENTS

| | | |
|---|---|---|
| WO | 9316491 A1 | 8/1993 |
| WO | 2019150210 A1 | 8/2019 |

* cited by examiner ing circuit includes a driving control module and a drive line electrically coupled with the driving control module. The driving control module is arranged below a part of the sub pixels electrically coupled with the driving circuit, and the drive line is electrically coupled with the sub pixels, respectively. The photosensitive element is arranged below the display screen, the display screen is mounted to the device body, and the photosensitive element is correspondingly arranged below the sub display area of the display screen.

It should be understood that the above general description and the detailed description below are merely used to explain the present disclosure, and cannot be construed as a limitation to the present disclosure.

DISPLAY PANEL, DISPLAY SCREEN AND ELECTRONIC DEVICE

CROSS-REFERENCE TO RELATED APPLICATION

This application claims priority to Chinese Patent Application Serial No. 201910894473.3, filed on Sep. 20, 2019, the disclosure of which is hereby incorporated by reference in its entirety.

BACKGROUND

With the development of a full screen concept, the integrity of a screen has been paid more and more attention. Great efforts have been made to solve the problem of an incomplete screen display caused by "bang" and "widow's peak" in the related art.

SUMMARY

The present disclosure relates generally to the field of display technologies, and more specifically to a display panel, a display screen, and an electronic device.

According to a first aspect of embodiments of the present disclosure, a display panel is provided, including a substrate and a plurality of pixels arranged on the substrate. The pixel includes a plurality of sub pixels and a driving circuit. The sub pixel includes a first electrode layer on the substrate, a light-emitting layer on the first electrode layer and a second electrode layer on the light-emitting layer. The driving circuit is arranged between the substrate and the first electrode layer. The driving circuit is electrically coupled with the sub pixels. The driving circuit includes a driving control module and a drive line electrically coupled with the driving control module. The driving control module is arranged below a part of the sub pixels electrically coupled with the driving circuit, and the drive line is electrically coupled with the sub pixels, respectively.

According to a second aspect of embodiments of the present disclosure, a display screen is provided, including a main display area and a sub display area. The sub display area is made of a display panel. The display panel includes a substrate and a plurality of pixels arranged on the substrate, and the pixel includes a plurality of sub pixels, and a driving circuit. The sub pixel includes a first electrode layer on the substrate, a light-emitting layer on the first electrode layer, and a second electrode layer on the light-emitting layer. The driving circuit is arranged between the substrate and the first electrode layer, and electrically coupled with the sub pixels. The driving circuit includes a driving control module and a drive line electrically coupled with the driving control module. The driving control module is arranged below a part of the sub pixels electrically coupled with the driving circuit, and the drive line is electrically coupled with the sub pixels, respectively.

According to a third aspect of embodiments of the present disclosure, an electronic device is provided, including a device body, a photosensitive element and a display screen. The display panel includes a substrate and a plurality of pixels arranged on the substrate, and the pixel includes a plurality of sub pixels, and a driving circuit. The sub pixel includes a first electrode layer on the substrate, a light-emitting layer on the first electrode layer, and a second electrode layer on the light-emitting layer. The driving circuit is arranged between the substrate and the first electrode layer, and electrically coupled with the sub pixels. The

BRIEF DESCRIPTION OF THE DRAWINGS

The accompanying drawings, which are incorporated in and constitute a part of this disclosure, illustrate embodiments consistent with the specification and, together with the description, serve to explain principles of various embodiments of the disclosure.

DETAILED DESCRIPTION

The present disclosure will be described in detail below with reference to the specific embodiments illustrated in the accompanying drawings. However, these embodiments do not limit the present disclosure, and changes in structure, method or function by those skilled in the related art according to these embodiments are included in the scope of the present disclosure.

Terms used in the present disclosure are only for the purpose of describing specific embodiments, and should not be construed to limit the present disclosure. As used in the present disclosure and the appended claims, "a" and "the" in a singular form intend to include a plural form, unless clearly indicated in the context otherwise. It should also be understood that, as used herein, the term "and/or" represents and contains any or all possible combinations of one or more associated listed items.

Some embodiments of the present disclosure will be described in detail below with reference to the accompanying drawings. In the case of non-contradiction, the embodiments of the present disclosure and the features of the embodiments may be combined with each other.

A photosensitive element (including a camera, light sensing element, etc.) may be arranged under the screen to achieve a full screen effect. In this case, the light transmittance of a display area corresponding to a position of the photosensitive element may need to be considered.

In an approach, the luminous pixel density (PPI) of the display panel can be reduced, to increase a light transmissivity of a partially transparent area so as to meet the light sensing requirements under the screen. However, the transparent area also does not emit light, which leads to an increase of a proportion of the area not emitting light. Thus, the human eyes tend to identify a grid area not emitting light, which is mainly indicated as a large particle sense of pixels, a black frame between pixels and a reduction in the display effect.

Figure 1:
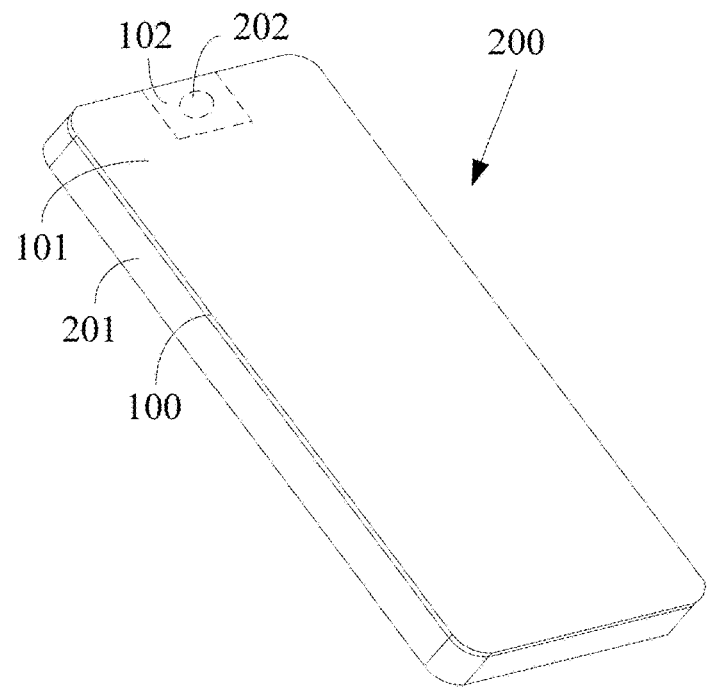
FIG. 1 is a schematic view of an electronic device according to some embodiments of the present disclosure.
Figure 2:
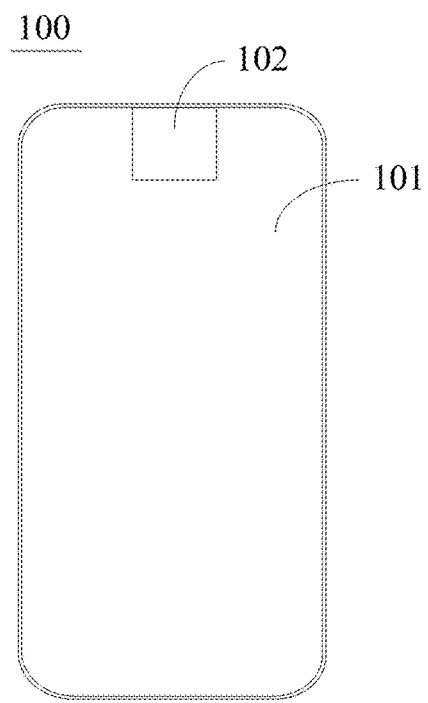
FIG. 2 is a schematic view of a display screen according to some embodiments of the present disclosure.

As illustrated in FIG. 1, an electronic device 200 according to an embodiment of the present disclosure includes a device body 201, a photosensitive element 202 and a display screen 100. The photosensitive element 202 includes a camera, a light-sensing sensor, a photosensitive element, etc. The photosensitive element 202 is located in the electronic device 200 and arranged below the display screen 100. The display screen 100 is mounted to the device body 201 and combined with an optical imaging system, so as to achieve good display and imaging functions at the same time.

The electronic device 200 of the present disclosure may be any device with a display screen, for example, a mobile communication terminal (such as mobile phone), a PDA (personal digital assistant, handheld computer), a mobile computer, a tablet computer, a wearable device and so on.

As illustrated in FIGS. 1 to 4, the display screen 100 includes a main display area 101 and a sub display area 102, and the sub display area 102 is made of a display panel 10 of the following embodiments. The main display area 101 of the present disclosure includes a substrate 1, a driving circuit 2, a first electrode layer 3, a light-emitting layer 4, and a second electrode layer 5 in sequence. The structure layers of the main display area 101 are basically the same with those of the sub display area 102, and the difference therebetween is that the sub display area 102 is designed with light transmittance.

The photosensitive element 202 is correspondingly arranged below the sub display area 102 of the display screen 100. The sub display area 102 may also allow the photosensitive element 202 to shoot through the sub display area 102 without affecting an image capturing effect of the photosensitive element 202, under the premise that a normal display is ensured. In this way, the photosensitive element 202 is arranged under the screen, and also a full-screen display of the electronic device 200 is achieved. The sub display area 102 may be arranged at any position of the display screen 100 according to application requirements.

In some embodiments, a size of the sub display area 102 is matched with that of the photosensitive element 202, so as to minimize the size of the sub display area 102 as much as possible, thereby reducing a size of an area of the display screen 100, which does not display when the photosensitive element 202 is being used for image capturing, and hence improving a visual experience of a user in use of the electronic device 200.

It should be noted that, in an optional embodiment, the display screen 100 may also only be provided with a sub display area 102, which is made of a display panel 10 of the following embodiments.

Figure 3:
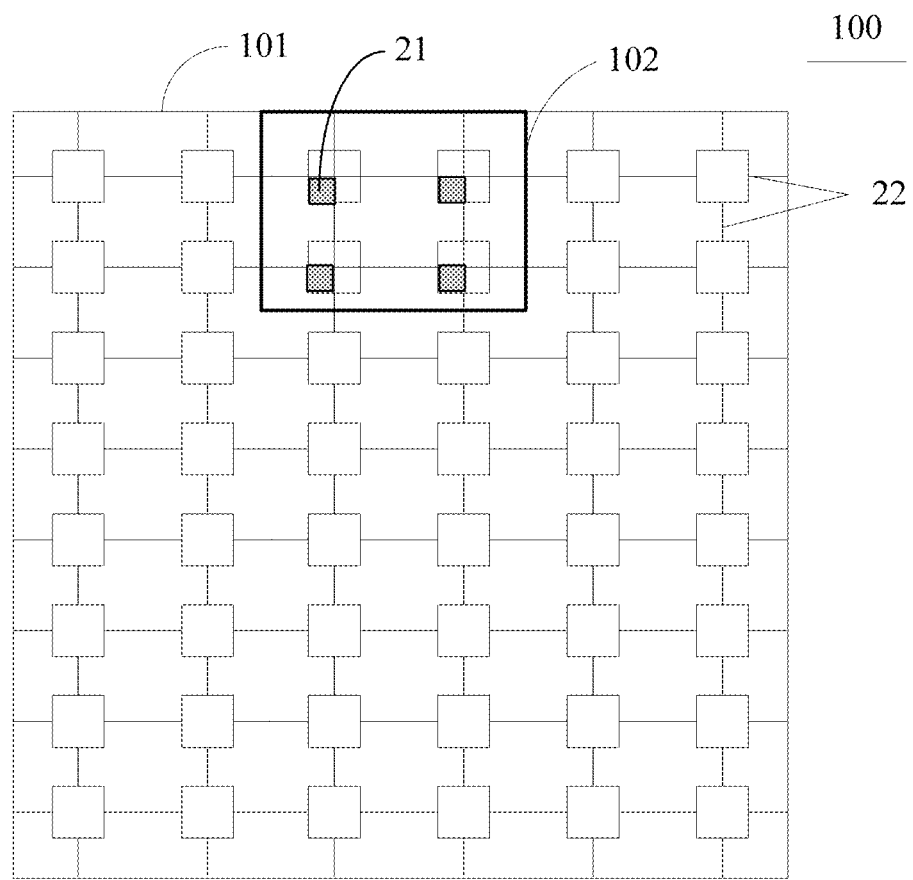
FIG. 3 is a schematic view of an internal structure of a display screen according to some embodiments of the present disclosure, in which a gray part indicates a position where a driving control module is arranged.
Figure 4:
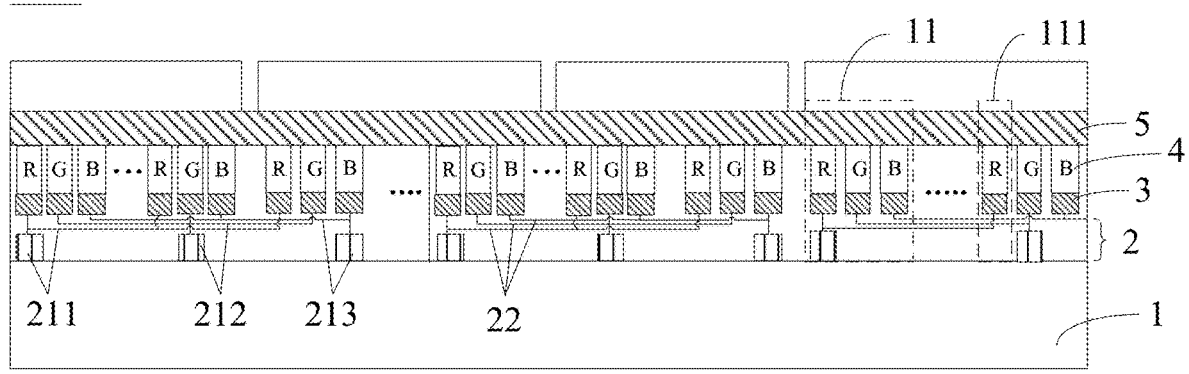
FIG. 4 is a sectional view of a display panel according to some embodiments of the present disclosure.

As illustrated in FIGS. 3 and 4, the display panel 10 according to the embodiment of the present disclosure includes a substrate 1 and a plurality of pixels 11 arranged on the substrate 1. The plurality of pixels 11 may be arranged on the substrate 1 in a matrix or in any shape. Each pixel 11 includes a plurality of sub pixels 111, which may also be arranged in a matrix or any shape. The light emitted by each sub pixel 111 is one of the three primary colors of red (R), green (G) and blue (B). In this way, the plurality of sub pixels 111 allow the pixel 11 to emit various colors of light through coordination of the three primary colors. The sub pixel 111 emitting RGB may be arranged in any color coordination manner, and the arrangement of RGB in the drawings is only a schematic illustration.

The sub pixel 111 includes a first electrode layer 3 on the substrate 1, a light-emitting layer 4 on the first electrode layer 3, and a second electrode layer 5 on the light-emitting layer 4. Further, the pixel 11 in the present disclosure also includes a driving circuit 2 arranged between the substrate 1 and the first electrode layer 3, and the driving circuit 2 is electrically coupled with the plurality of sub pixels 111. When an electric power is supplied with an appropriate voltage, the driving circuit 2 driving electric charges in the first electrode layer 3 and in the second electrode layer 5 to combine with each other in the light-emitting layer 4, such that the light-emitting layer 4 emits light.

The light-emitting layer 4 includes a plurality of light-emitting structural blocks correspondingly arranged on the first electrode layer 3. The light-emitting layer 4 may adopt an Organic Light-Emitting Diode (OLED).

In embodiments of the present disclosure, the substrate 1 may be a rigid substrate, for example, a transparent substrate such as a glass substrate, a quartz substrate or a plastic substrate. The substrate 1 may also be a flexible transparent substrate, such as polyimide (PI) film, so as to improve the transparency of the device.

The first electrode layer 3 is an anode layer and the second electrode layer 5 is a cathode layer. Of course, in other embodiments, the first electrode layer 3 may also be a cathode layer, and the second electrode layer 5 may be an anode layer. In an embodiment, the first electrode layer 3 is made of non-transparent materials, and the second electrode layer 5 is made of transparent materials. In another embodiment, both the first electrode layer 3 and the second electrode layer 5 are made of transparent materials. In this way, the sub display panel 10 can meet requirements of normal display and also carry out a light transmittance control according to use requirements.

In the present disclosure, the transparent materials may be any transparent conductive materials. In some embodiments, the transparent materials may include at least one of silver, magnesium, magnesium silver alloy, indium tin oxide, indium zinc oxide or the like, for example, indium tin oxide doped with silver or indium zinc oxide doped with silver. In some embodiments, the transparent materials for preparing the first electrode layer 3 and the second electrode layer 5 adopt the indium tin oxide doped with silver or the indium zinc oxide doped with silver, to reduce resistances of the first electrode layer 3 and the second electrode layer 5 on the basis of ensuring a high transmittance of the display panel 10.

The driving circuit 2 of the present disclosure includes a driving control module 21 and a drive line 22 electrically coupled with the driving control module 21. The driving control module 21 transmits a driving signal through the drive line 22. The driving control module 21 is used to driving electric charges in the first electrode layer 3 and the second electrode layer 5 to combine in the light-emitting layer 4, such that the light-emitting layer 4 emits light.

In some embodiments, the driving control module 21 includes one or more control switches, resistances, capacitances and other components. The driving control module 21 connects a plurality of control switches in series or in parallel as required. The driving circuit 2 is a 2T1C circuit, or 3T1C circuit, or 3T2C circuit, or 7T1C circuit, or 7T2C circuit or other pixel circuits.

The control switch may be a thin-film transistor (TFT), which can be an oxide thin film transistor or a low temperature polysilicon thin film transistor (LTPS TFT). In some embodiments, the thin film transistor may be an indium gallium zinc oxide thin film transistor (IGZO TFT). Alternatively, the control switch may also be a metal oxide semiconductor field effect transistor (MOSFET), or other elements with switching characteristics in the related art, such as an insulated gate bipolar transistor (IGBT). The electronic element that can realize the switch function in this embodiment and also can be integrated into the display panel 10 should be included in the protection scope of the present disclosure.

The driving control module 21 is arranged below a part of the sub pixels 111 electrically coupled with the driving circuit 2, and the drive line 22 is electrically coupled with the sub pixels 111 respectively to drive the sub pixels 111 to emit light. In this embodiment, since the driving control module 21 does not have light transmittance, the sub pixels 111 share one driving circuit 2, so as to reduce an area of an opaque portion in the display panel 10 as much as possible. In the present disclosure, one driving circuit 2 is shared by the sub pixels 111 to reduce the number of the driving circuits 2 and the area occupied thereby, thus further enhancing a light transmittance effect of the display panel 10.

Further, in order to reduce a size of the driving circuit 2, the driving control module 21 in the present disclosure is arranged below any one of the sub pixels 111 electrically coupled to the driving circuit 2. Further, in embodiments of the present disclosure, the sub pixels 111 electrically coupled with the same driving circuit 2 are sub pixels 111 having the same emission color, thus facilitating the control of the driving circuit 2 and the regulation of the display of the display panel 10.

Figure 5:
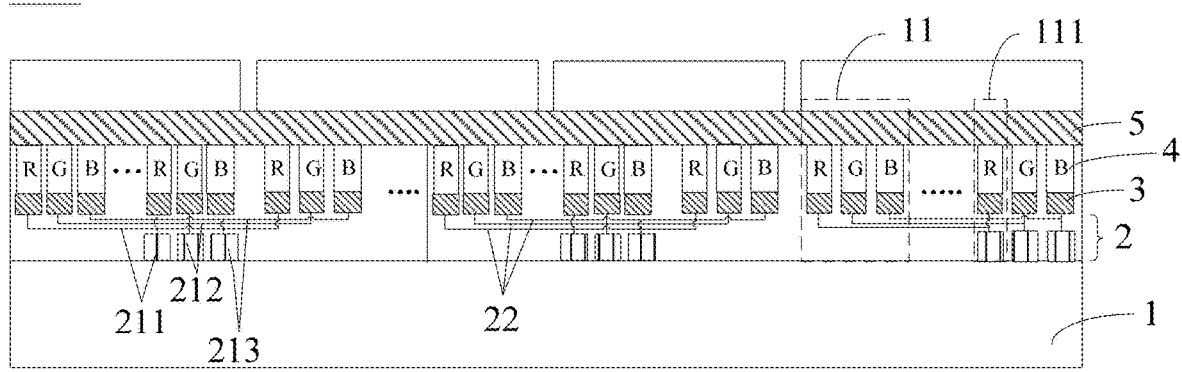
FIG. 5 is a sectional view of a display panel according to some other embodiments of the present disclosure.

As illustrated in FIG. 4 and FIG. 5, the driving circuit 2 includes a first driving circuit 211, a second driving circuit 212 and a third driving circuit 213. The emission colors of the sub pixels 111 connected with the first driving circuit 211, the second driving circuit 212 and the third driving circuit 213 are different from each other. For example, the sub pixels 111 connected with the first driving circuit 211 emit red (R) light, the sub pixels 111 connected with the second driving circuit 212 emit green (G) light, and the sub pixels 111 connected with the third driving circuit 213 emit blue (B) light.

In an embodiment, as illustrated in FIG. 4, the driving control modules 21 in the first driving circuit 211, the second driving circuit 212 and the third driving circuit 213 are arranged below different pixels 11 respectively, so as to weaken the opacity of the driving control module 21 in the driving circuit 2, thus improving the whole light transmittance effect of the display panel 10 and avoiding the concentration of the driving control modules 21, which otherwise leads to obvious black spots on the display panel 10.

Figure 6:
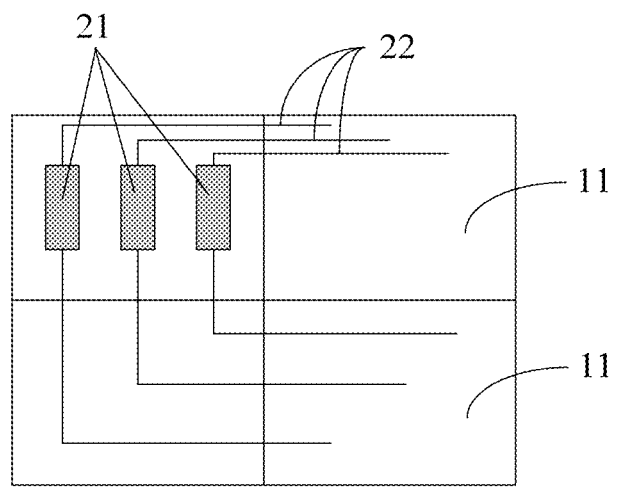
FIG. 6 is a schematic view of a layout of a driving circuit in a plurality of pixels of a display panel according to some other embodiments of the present disclosure.

In another embodiment, as illustrated in FIG. 5, the driving control modules 21 in the first driving circuit 211, the second driving circuit 212 and the third driving circuit 213 are arranged below the same pixel 11, in such a way that the opaque portions, i.e. the driving control modules 21 are concentratedly arranged to avoid an image capturing area of the photosensitive element, so as to enhance the light transmittance in other positions of the display panel 10 and improve the image capturing effect of the photosensitive element. As illustrated in FIG. 6, in an example, for example, in a 2*2 pixel 11, the driving control modules 21 are arranged below one of the pixels 11, and the other three pixels 11 are connected through the drive lines 22, such that one driving control module 21 controls four pixels 11, thus meeting the display effect of the display panel 10, and the other three pixels 11 have good light transmittance when not displaying, thus facilitating the image capturing of the photosensitive element.

Figure 7:
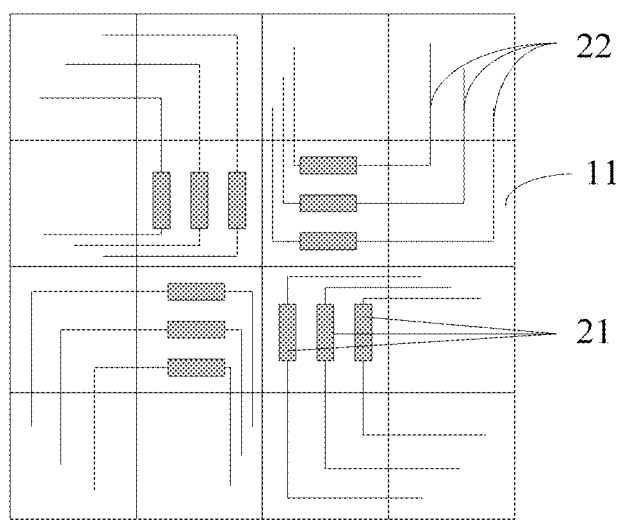
FIG. 7 is a schematic view of a pixel array in a display panel according to some other embodiments of the present disclosure.

As illustrated in FIG. 7, in this embodiment, the display panel 10 includes a plurality of pixel arrays, and pixel array is composed of pixels 11. In each pixel array, the pixels 11 provided with the driving control modules 21 are arranged adjacent to each other, such that the pixels 11 provided with the driving control modules 21 are positioned in the middle of the pixel array. In an example, as illustrated in FIG. 7, the pixel array is composed of four 2*2 pixels 11. In the 2*2 pixel 11, the driving control modules 21 are arranged below one of the pixels 11, and the other three pixels 11 are connected through the drive line 22. In this example, the pixels 11 provided with the driving control modules 21 among the four 2*2 pixels are concentrated in the middle of the pixel array, so as to avoid scattering or reflection of the whole display panel 10 due to the dispersed driving circuits 2, which otherwise causes stray light to be generated when exit light converges on an imaging surface, and thus reduces the overall imaging quality of the display panel 10.

Figure 8:
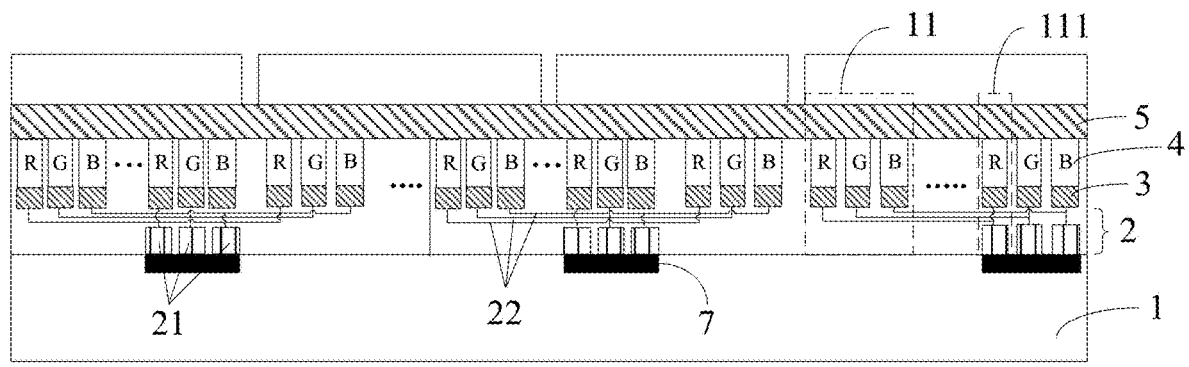
FIG. 8 is a sectional view of a display panel according to some other embodiments of the present disclosure.

At present, in the display panel 10, since incident light will be scattered or reflected by the driving circuit 2 or other opaque materials, the exit light deviates from a direction of the incident light, such that the stray light is generated when the exit light converges on the imaging surface, thus reducing the imaging quality of the display panel 10. In order to solve this technical problem, as illustrated in FIG. 8, the display panel 10 in the present disclosure also includes a light shielding layer 7 arranged between the substrate 1 and the driving circuit 2, and the light shielding layer 7 covers the pixels 11 provided with the driving control modules 21. The arrangement of the light shielding layer 7 can effectively reduce the imaging quality loss caused by scattering or reflection, and improve the resolving power of the display panel 10.

For the overall layout of the driving circuit 2 in the display panel 10, at least three embodiments are included as follows.

Figure 9:
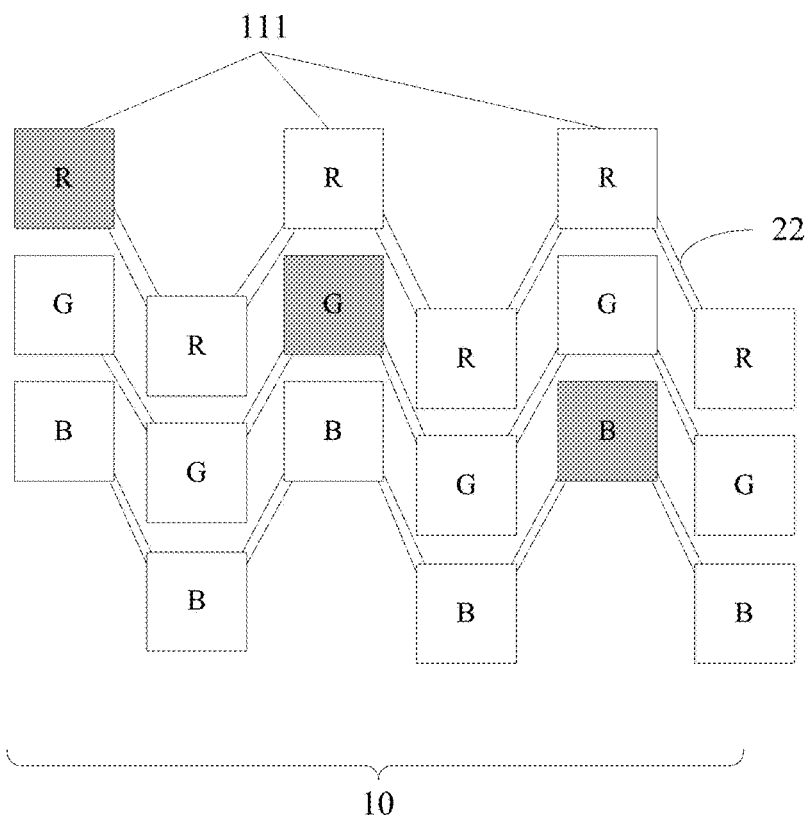
FIG. 9 is a schematic view of a layout of sub pixels in a display panel according to some embodiments of the present disclosure, in which a gray part indicates a position where a driving control module is arranged.

In an embodiment, as illustrated in FIG. 9, a plurality of driving control modules 21 are provided in the driving circuit 2, and uniformly distributed in the display panel 10, so as to weaken the opacity of the driving control modules 21 in the driving circuit 2, thus improving the whole light transmittance effect of the display panel 10 and avoiding the concentration of the plurality of driving control modules 21, which otherwise leads to obvious black spots on the display panel 10.

Figure 10:
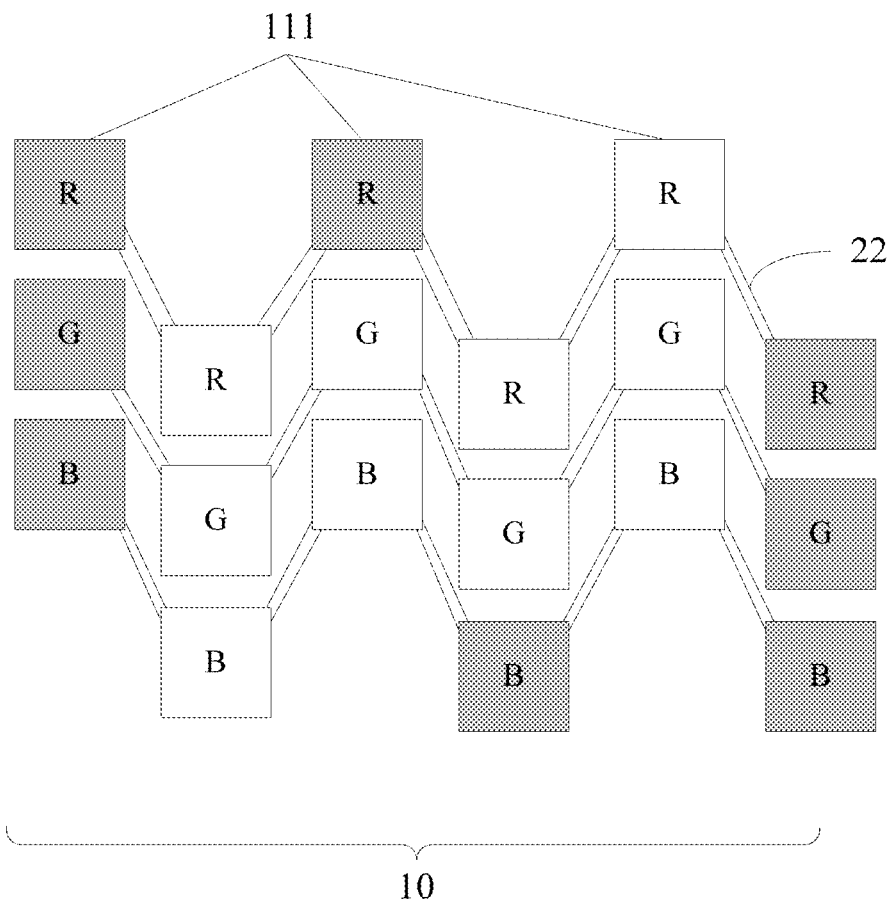
FIG. 10 is a schematic view of a layout of sub pixels in a display panel according to some embodiments of the present disclosure, in which a gray part indicates a position where a driving control module is arranged.

In another embodiment, as illustrated in FIG. 10, a plurality of driving control modules 21 are provided in the driving circuit 2, and arranged at an edge of the display panel 10, such that the driving control modules 21 are located at a periphery of a lens in the molded component, thus facilitating improvements of the photosensitive effect of the photosensitive element.

Figure 11:
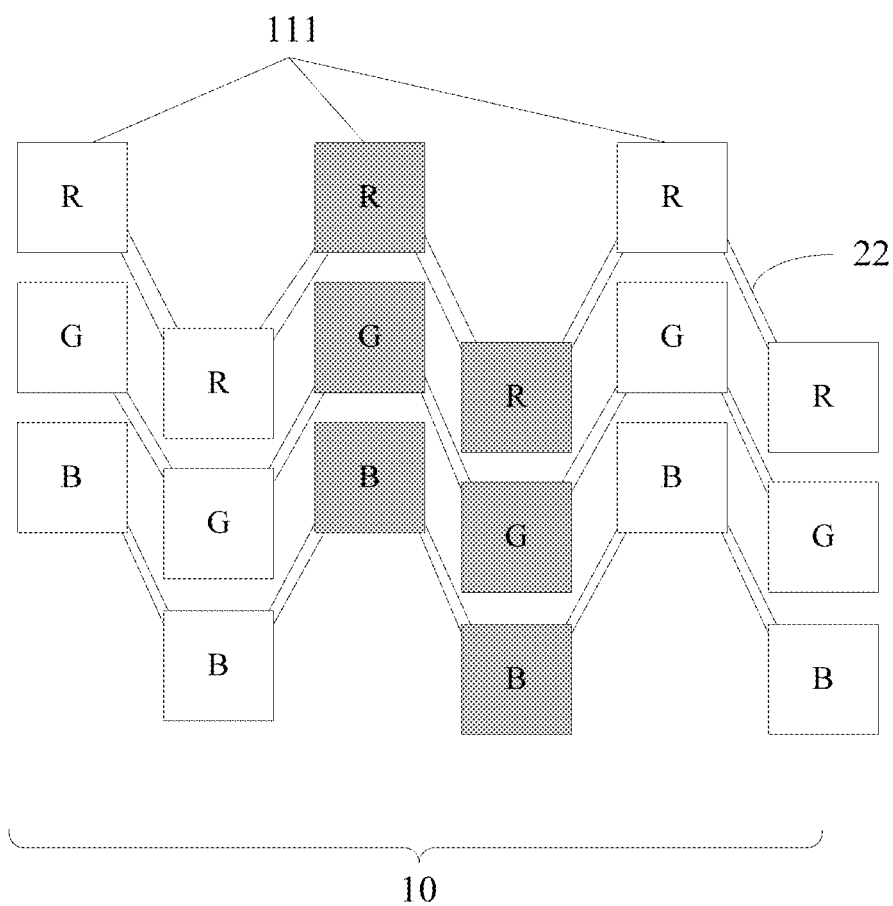
FIG. 11 is a schematic view of a layout of sub pixels in a display panel according to some embodiments of the present disclosure, in which a gray part indicates a position where a driving control module is arranged.

In another embodiment, as illustrated in FIG. 11, a plurality of driving control modules 21 are provided in the driving circuit 2, and arranged below the pixels 11 in the center of the display panel 10, such that the opaque driving control module 21 are concentratedly arranged, so as to improve the overall imaging quality of the photosensitive element.

The display panel in the present disclosure improves the structure of the driving circuit layer to reduce the number of opaque driving control modules in the driving circuit layer. With the sub pixels sharing one driving control module, the display effect of the display panel can be met, and also the light transmissivity of the display panel can be improved.

The above embodiments take the camera under the screen as an example for exemplary explanations. Of course, the display panel with the light transmittance effect in the present disclosure is not limited to being applied to the camera under the screen, but also may be applied to a light sensing element such as a light sensing sensor, a fingerprint unlocking element under the screen, etc., which are not specifically limited herein.

The various circuits, device components, modules, units, blocks, or portions may have modular configurations, or are composed of discrete components, but nonetheless can be referred to as "units," "modules," or "portions" in general. In other words, the "circuits," "components," "modules," "blocks," "portions," or "units" referred to herein may or may not be in modular forms.

In the present disclosure, it is to be understood that the terms "lower," "upper," "center," "longitudinal," "transverse," "length," "width," "thickness," "upper," "lower," "front," "back," "left," "right," "vertical," "horizontal," "top," "bottom," "inside," "outside," "clockwise," "counterclockwise," "axial," "radial," "circumferential," "column," "row," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the present disclosure, a first element being "on," "over," "under" or "below" a second element may indicate direct contact between the first and second elements, without contact, or indirect through an intermediate medium, unless otherwise explicitly stated and defined.

Moreover, a first element being "above," "over," or "at an upper surface of" a second element may indicate that the first element is directly above the second element, or merely that the first element is at a level higher than the second element. The first element "below," "underneath," or "at a lower surface of" the second element may indicate that the first element is directly below the second element, or merely that the first element is at a level lower than the second feature. The first and second elements may or may not be in contact with each other.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

The display screen may be implemented with a computer and/or a display device, e.g., a VR/AR device, a head-mount display (HMD) device, a head-up display (HUD) device, smart eyewear (e.g., glasses), LCD (liquid-crystal display), OLED (organic light emitting diode) display, other flexible configuration, or any other monitor for displaying information to the user.

Other types of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In an example, a user can speak commands to the audio processing device, to perform various operations.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features may be described above as acting in certain combinations and even initially claimed as such, one or more features from a claimed combination can in some cases be excised from the combination, and the claimed combination may be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An electronic device comprising:
a device body;
a photosensitive element; and
a display screen,
the photosensitive element being arranged under the display screen;
the display screen comprising a main display area and a sub display area,
the sub display area comprising a display panel, comprising:
a substrate; and
a plurality of pixels arranged over the substrate, the pixel comprising:
a plurality of sub pixels, each sub pixel comprising:
a first electrode layer over the substrate;
a light-emitting layer over the first electrode layer; and
a second electrode layer over the light-emitting layer; and
a driving circuit arranged between the substrate and the first electrode layer, the driving circuit being electrically coupled with the plurality of sub pixels, the driving circuit comprising a driving control module and a drive line electrically coupled with the driving control module,
wherein the driving control module is arranged under a portion of the plurality sub pixels electrically coupled with the driving circuit, and the drive line is electrically coupled with the sub pixels, respectively;
wherein the display screen is mounted to the device body, and the photosensitive element is correspondingly arranged below the sub display area of the display screen; and
wherein the sub display area is configured to facilitate the photosensitive element capturing images through the sub display area, and has a size matched with a size of the photosensitive element so as to minimize a non-display area of the display screen during the photosensitive element capturing the images, thereby achieving a full-screen display effect of the electronic device.

2. The electronic device according to claim 1, wherein the driving control module is arranged below any one of the sub pixels electrically coupled with the driving circuit.

3. The electronic device according to claim 1, wherein the sub pixels electrically coupled with the same driving circuit are sub pixels having the same emission color.

4. The electronic device according to claim 3, wherein the driving circuit comprises a first driving circuit, a second driving circuit and a third driving circuit, and the emission colors of the sub pixels connected with the first driving circuit, the second driving circuit and the third driving circuit are different from each other.

5. The electronic device according to claim 4, where the driving control modules in the first driving circuit, the second driving circuit and the third driving circuit are arranged below different pixels, respectively.

6. The electronic device according to claim 5, wherein the display panel comprises a plurality of pixel arrays, and the pixel array comprises pixels,
wherein the pixels provided with the driving control modules are arranged adjacent to each other in the pixel array.

7. The electronic device according to claim 6, wherein the display panel further comprises a light shielding layer arranged between the substrate and the driving circuit, and the light shielding layer is covered on the pixels provided with the driving control modules.

8. The electronic device according to claim 4, wherein the driving control modules in the first driving circuit, the second driving circuit and the third driving circuit are arranged below the same pixel.

9. The electronic device according to claim 8, wherein the display panel comprises a plurality of pixel arrays, and the pixel array comprises pixels,
wherein the pixels provided with the driving control modules are arranged adjacent to each other in the pixel array.

10. The electronic device according to claim 9, wherein the display panel further comprises a light shielding layer arranged between the substrate and the driving circuit, and the light shielding layer is covered on the pixels provided with the driving control modules.

11. The electronic device according to claim 1, wherein a plurality of the driving control modules are provided in the driving circuit, and are uniformly distributed in the display panel.

12. The electronic device according to claim 1, wherein a plurality of the driving control modules are provided in the driving circuit, and are arranged at an edge of the display panel.

13. The electronic device according to claim 1, wherein a plurality of the driving control modules are provided in the driving circuit, and are arranged below the pixels in a center of the display panel.

14. The electronic device according to claim 1, wherein the first electrode layer is an anode layer and the second electrode layer is a cathode layer.

15. The electronic device according to claim 1, wherein the first electrode layer is made of non-transparent materials and the second electrode layer is made of transparent materials.

16. The electronic device according to claim 15, wherein the transparent materials comprise at least one of silver, magnesium, magnesium silver alloy, indium tin oxide, or indium zinc oxide.

17. The electronic device according to claim 1, wherein both the first electrode layer and the second electrode layer are made of transparent materials.

18. A mobile terminal comprising the electronic device according to claim 17, wherein:
    number of non-transparent driving control modules in the driving circuit layer is reduced by having multiple sub pixels sharing a common driving control module, to thereby improve light transmissivity of the display panel; and
    the transparent materials comprise at least one of silver, magnesium, magnesium silver alloy, indium tin oxide, or indium zinc oxide.

19. A display screen, comprising a main display area and a sub display area, the sub display area being made of a display panel, and the display panel comprising:
    a substrate; and
    a plurality of pixels arranged over the substrate, each pixel comprising:
        a plurality of sub pixels, each sub pixel comprising:
            a first electrode layer over the substrate;
            a light-emitting layer over the first electrode layer; and
            a second electrode layer over the light-emitting layer; and
        a driving circuit arranged between the substrate and the first electrode layer, the driving circuit being electrically coupled with the sub pixels, the driving circuit comprising a driving control module and a drive line electrically coupled with the driving control module,
    wherein the driving control module is arranged under a portion of the sub pixels electrically coupled with the driving circuit, and the drive line is electrically coupled with the sub pixels, respectively; and
    wherein the driving circuit is shared by the plurality of sub pixels to reduce an opaque portion in the display panel, and the driving module is arranged to avoid an image capturing area for light to pass through the display panel, thereby increasing light transmittance of the display panel.

20. An electronic device, comprising a device body, a photosensitive element and a display screen, the photosensitive element being arranged under the display screen, the display screen comprising a main display area and a sub display area, the sub display area being made of a display panel, and the display panel comprising:
    a substrate; and
    a plurality of pixels arranged over the substrate, the pixel comprising:
        a plurality of sub pixels, the sub pixel comprising:
            a first electrode layer over the substrate;
            a light-emitting layer over the first electrode layer; and
            a second electrode layer over the light-emitting layer; and
        a driving circuit arranged between the substrate and the first electrode layer, the driving circuit being electrically coupled with the sub pixels, the driving circuit comprising a driving control module and a drive line electrically coupled with the driving control module,
    wherein the driving control module is arranged under a part of the sub pixels electrically coupled with the driving circuit, and the drive line is electrically coupled with the sub pixels, respectively,
    wherein the display screen is mounted to the device body, and the photosensitive element is correspondingly arranged below the sub display area of the display screen; and
    wherein the sub display area has a size matched with a size of the photosensitive element so as to minimize a non-display area of the display screen during the photosensitive element capturing images, thereby achieving a full-screen display effect of the electronic device.

* * * * *